United States Patent
Zang et al.

(10) Patent No.: US 10,727,136 B2
(45) Date of Patent: Jul. 28, 2020

(54) INTEGRATED GATE CONTACT AND CROSS-COUPLING CONTACT FORMATION

(71) Applicant: GLOBALFOUNDRIES Inc., Grand Cayman (KY)

(72) Inventors: Hui Zang, Guilderland, NY (US); Ruilong Xie, Niskayuna, NY (US); Chanro Park, Clifton Park, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 56 days.

(21) Appl. No.: 16/185,675

(22) Filed: Nov. 9, 2018

(65) Prior Publication Data

US 2020/0152518 A1 May 14, 2020

(51) Int. Cl.
*H01L 21/336* (2006.01)
*H01L 21/8234* (2006.01)
*H01L 29/78* (2006.01)
*H01L 29/40* (2006.01)
*H01L 29/423* (2006.01)
*H01L 21/768* (2006.01)
*H01L 29/417* (2006.01)

(52) U.S. Cl.
CPC ........ *H01L 21/823475* (2013.01); *H01L 21/76897* (2013.01); *H01L 29/401* (2013.01); *H01L 29/41791* (2013.01); *H01L 29/42372* (2013.01); *H01L 29/785* (2013.01)

(58) Field of Classification Search
CPC ....... H01L 21/823475; H01L 21/76897; H01L 29/401; H01L 29/41791; H01L 29/42377; H01L 29/785

USPC .......................................... 257/401; 438/286
See application file for complete search history.

(56) References Cited

U.S. PATENT DOCUMENTS

| | | |
|---|---|---|
| 7,853,324 B2 | 12/2010 | Stevenson et al. |
| 9,006,841 B2 | 4/2015 | Kumar et al. |
| 2007/0112398 A1 | 5/2007 | Stevenson et al. |

(Continued)

OTHER PUBLICATIONS

Hui Zang et al., "Self-Aligned Gate Contact and Cross-Coupling Contact Formation" filed Jun. 11, 2018 as U.S. Appl. No. 16/004,935.

*Primary Examiner* — Long K Tran
(74) *Attorney, Agent, or Firm* — Thompson Hine LLP; Francois Pagette

(57) ABSTRACT

Methods of forming cross-coupling contacts for field-effect transistors and structures for field effect-transistors that include cross-coupling contacts. A dielectric cap is formed over a gate structure and a sidewall spacer adjacent to a sidewall of the gate structure. A portion of the dielectric cap is removed from over the sidewall spacer and the gate structure to expose a first portion of the gate electrode of the gate structure at a top surface of the gate structure. The sidewall spacer is then recessed relative to the gate structure to expose a portion of the gate dielectric layer at the sidewall of the gate structure, which is removed to expose a second portion of the gate electrode of the gate structure. A cross-coupling contact is formed that connects the first and second portions of the gate electrode of the gate structure with an epitaxial semiconductor layer adjacent to the sidewall spacer.

7 Claims, 9 Drawing Sheets

(56) References Cited

U.S. PATENT DOCUMENTS

2009/0020819 A1* 1/2009 Anderson ......... H01L 29/41791
257/365
2009/0163980 A1 6/2009 Stevenson
2010/0078711 A1* 4/2010 Goldbach ......... H01L 29/66795
257/329
2018/0329428 A1* 11/2018 Nagy ................... G05D 1/0287

* cited by examiner

INTEGRATED GATE CONTACT AND CROSS-COUPLING CONTACT FORMATION

BACKGROUND

The present invention relates to semiconductor device fabrication and integrated circuits and, more specifically, to methods of forming gate contacts and cross-coupling contacts for field-effect transistors, as well as structures for field effect-transistors that include gate contacts and cross-coupling contacts.

Contacts may provide vertical electrical connections extending to features of semiconductor devices, such as the gate electrode and source/drain regions of a field-effect transistor. Self-aligned contacts are formed in contact openings that are constrained during etching by the configuration of adjacent structures, such as sidewall spacers and gate caps associated with the gate electrodes, as opposed to being constrained by a patterned resist.

Self-aligned contacts connected with the gate electrodes of field-effect transistors may be categorized into distinct types. One type of self-aligned contact, which is only connected with a gate electrode, is electrically isolated from nearby features, such as the epitaxial semiconductor material forming the source and drain regions of the field-effect transistor. Another type of self-aligned contact cross-couples a gate electrode with the epitaxial semiconductor material forming either the source region or drain region of the field-effect transistor, and may be used, for example, to provide cross-coupling of inverters in a logic cell. When forming a self-aligned cross-coupling contact, the top surface of the gate electrode is opened by at least partial removal of a dielectric gate cap.

A self-aligned contact providing cross-coupling may lack robustness if the constituent conductor formed over the gate electrode is overly thin. Such over thinning may occur during polishing to planarize the conductor that is deposited to form the self-aligned cross-coupling contact. In addition, the semiconductor material forming the related source region or drain region may be exposed to the etching process that at least partially removes the dielectric gate cap to open the top surface of the gate electrode, which can damage the semiconductor material.

Improved methods of forming self-aligned gate contacts and cross-coupling contacts for field-effect transistors, as well as structures for field effect-transistors that include self-aligned gate contacts and cross-coupling contacts, are needed.

SUMMARY

In an embodiment of the invention, a method includes forming a gate structure that includes a gate electrode and a gate dielectric layer, forming a sidewall spacer adjacent to a sidewall of the gate structure, forming a dielectric cap over the gate structure and the sidewall spacer, and forming an epitaxial semiconductor layer adjacent to the sidewall spacer. The method further includes removing a portion of the dielectric cap from over the sidewall spacer and the gate structure to expose a first portion of the gate electrode of the gate structure at a top surface of the gate structure. After removing the portion of the dielectric cap, the sidewall spacer is recessed relative to the gate structure to expose a portion of the gate dielectric layer at the sidewall of the gate structure. The method further includes removing the portion of the gate dielectric layer from the sidewall of the gate structure to expose a second portion of the gate electrode of the gate structure, and forming a cross-coupling contact that connects the first portion and the second portion of the gate electrode of the gate structure with the epitaxial semiconductor layer.

In an embodiment of the invention, a structure includes a gate structure including a first sidewall and a second sidewall opposite from the first sidewall, a first liner, a first sidewall spacer adjacent to the first sidewall of the gate structure, a second liner, and a second sidewall spacer adjacent to the second sidewall of the gate structure. The first sidewall spacer is arranged between the first liner and the first sidewall of the gate structure. The second sidewall spacer is arranged between the second liner and the second sidewall of the gate structure. The structure further includes an epitaxial semiconductor layer separated from the gate structure by the first liner and the first sidewall spacer, and a cross-coupling contact extending over the first sidewall spacer and the first liner to connect the gate structure with the epitaxial semiconductor layer. The first sidewall spacer is shorter than the second sidewall spacer, and the first liner is shorter than the second liner.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
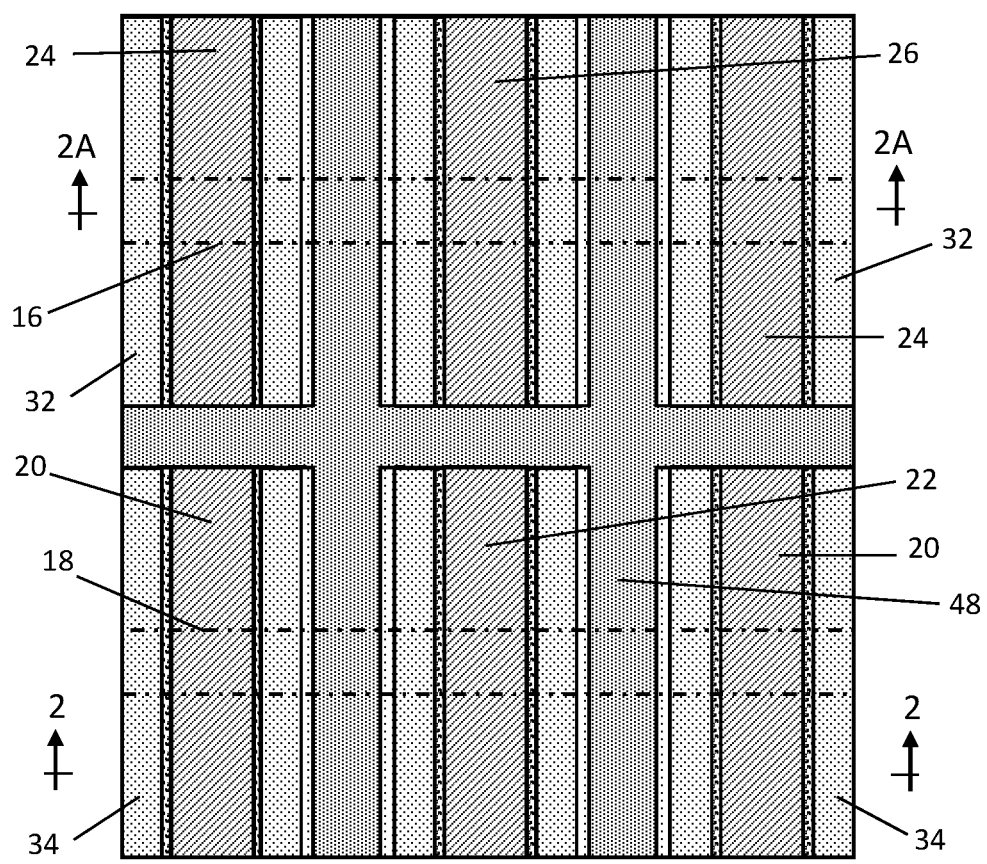
FIG. 1 is a top view of a structure at an initial fabrication stage of a processing method in accordance with embodiments of the invention.
Figure 2:
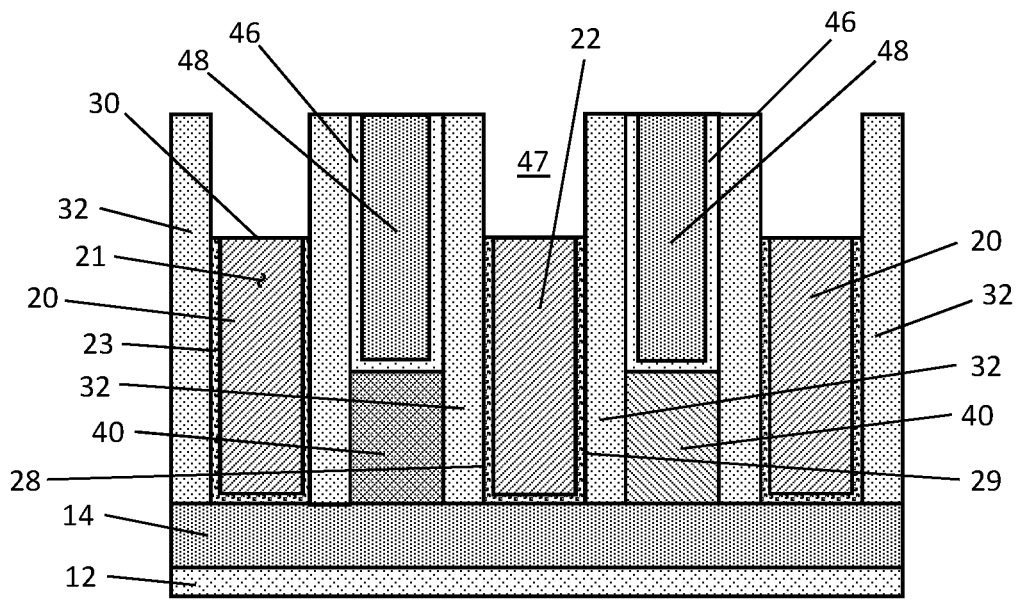
FIG. 2 is a cross-sectional view taken generally along line 2-2 in FIG. 1.
Figure 2A:
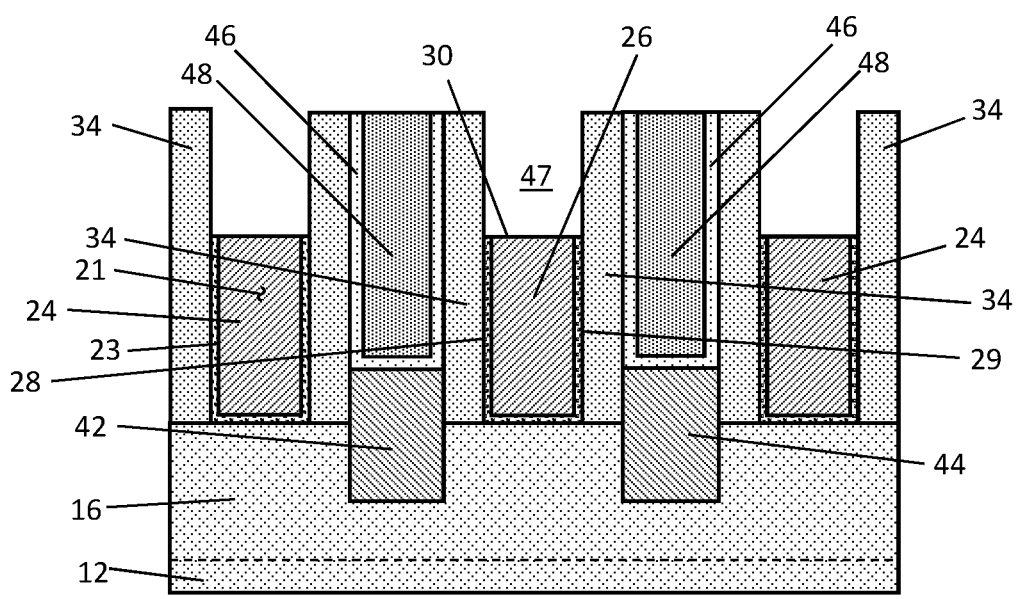
FIG. 2A is a cross-sectional view taken generally along line 2A-2A in FIG. 1.

With reference to FIGS. 1, 2, 2A and in accordance with embodiments of the invention, fins 16, 18 of an integrated circuit structure are formed that project from a top surface of a substrate 12. The fins 16, 18 may be formed by patterning the single-crystal semiconductor material (e.g., single-crystal silicon) of the substrate 12 with lithography and etching processes, and with cuts that provide a layout associated with the specific device structures being formed and their arrangement. Trench isolation regions 14 are formed that operate to electrically isolate the fins 16, 18 from each other. The trench isolation regions 14 may be formed by depositing a layer composed of a dielectric material, such as an oxide of silicon (e.g., silicon dioxide), by chemical vapor deposition, and recessing with an etching process to expose an upper portion of each of the fins 16, 18.

Gate structures 20, 22, 24, 26 of the integrated circuit structure are formed that extend over the fins 16, 18 and the trench isolation regions 14. The gate structures 20, 22 formed in one region of the integrated circuit structure overlap with the fin 18, and the gate structures 24, 26 are formed in another region of the integrated circuit structure overlap with the fin 16. Each of the gate structures 20, 22, 24, 26 includes a side surface or sidewall 28 and a side surface or sidewall 29 that is opposite from the sidewall 28, as well as a top surface 30 that connects the sidewalls 28, 29.

The gate structures 20, 22, 24, 26 may each include a gate electrode 21 and a gate dielectric layer 23 that is composed of a dielectric material, such as a high-k dielectric material like hafnium oxide. The gate electrode 21 may include one or more conformal barrier metal layers and/or work function metal layers, such as layers composed of titanium aluminum carbide and/or titanium nitride, and a metal gate fill layer composed of a conductor, such as tungsten. The gate electrode 21 of the gate structures 20, 22 and the gate electrode 21 of the gate structures 24, 26 may have different combinations of the conformal barrier metal layers and/or work function metal layers. For example, the gate electrode 21 of the gate structures 20, 22 may include conformal work function metal layers characteristic of a p-type field-effect transistor, and the gate electrode 21 of the gate structures 24, 26 may include conformal work function metal layers characteristic of an n-type field-effect transistor.

Sidewall spacers 32 are arranged on the opposite sidewalls 28, 29 of the gate structures 20, 22, and sidewall spacers 34 are arranged on the sidewalls 28, 29 of the gate structures 24, 26. The sidewall spacers 32, 34 may be may be composed of a low-k dielectric material, such as SiOCN, that is deposited and etched with an anisotropic etching process, such as reactive ion etching.

Semiconductor layers 40 are epitaxially grown from the fins 18 by an epitaxial growth process, and semiconductor layers 42, 44 are epitaxially grown from the fins 16 by an epitaxial growth process. In an embodiment, the epitaxial semiconductor layers 40 may contain silicon-germanium doped during epitaxial growth with a p-type dopant (e.g., boron, aluminum, gallium, and/or indium) that provides p-type electrical conductivity, and the epitaxial semiconductor layers 42, 44 may contain silicon doped during epitaxial growth with an n-type dopant (e.g., phosphorus and/or arsenic) that provides n-type electrical conductivity. Due to lateral growth during the epitaxial growth processes, portions of the epitaxial semiconductor layers 40 are arranged between the gate structures 20, 22, and portions of the epitaxial semiconductor layers 42, 44 are arranged between the gate structures 24, 26. The epitaxial semiconductor layers 40 furnish source/drain regions for field-effect transistors formed using the fin 18, and the epitaxial semiconductor layers 42, 44 furnish source/drain regions for field-effect transistors formed using the fin 16. As used herein, the term "source/drain region" means a doped region of semiconductor material that can function as either a source or a drain of a field-effect transistor.

A conformal contact etch stop layer (CESL) 46 and an interlayer dielectric layer 48 are formed in spaces over the epitaxial semiconductor layers 40, 42, 44. The CESL 46 provides a liner arranged over the epitaxial semiconductor layers 40, 42, 44 and also arranged between the sidewall spacers 32, 34 and the sections of interlayer dielectric layer 48. The CESL 46 may be composed of a layer of a dielectric material, such as silicon nitride, deposited by atomic layer deposition. The interlayer dielectric layer 48 may be composed of a dielectric material, such as an oxide of silicon (e.g., silicon dioxide), that may be deposited by chemical vapor deposition and planarized, and that is different in composition from the dielectric material of the sidewall spacers 32, 34. A section of the CESL 46 and a section of the interlayer dielectric layer 48 are arranged adjacent to the sidewall 28 of the gate structure 26, and another section of the CESL 46 and another section of the interlayer dielectric layer 48 are arranged adjacent to the sidewall 29 of the gate structure 26.

Cavities 47 are formed by recessing the gate electrode 21 and gate dielectric layer 23 of the gate structures 20, 22, 24, 26 relative to the sidewall spacers 32, the CESL 46, and the interlayer dielectric layer 48 using one or more selective etching processes. The cavities 47 are bordered by the top surface 30 of the gate structures 20, 22, 24, 26 and the exposed side surfaces of the sidewall spacers 32. In particular, portions of the sidewall spacers 32 are arranged above the recessed top surface 30 of the gate structures 20, 22, and portions of the sidewall spacers 34 are arranged above the recessed top surface 30 of the gate structures 24, 26.

Figure 3:
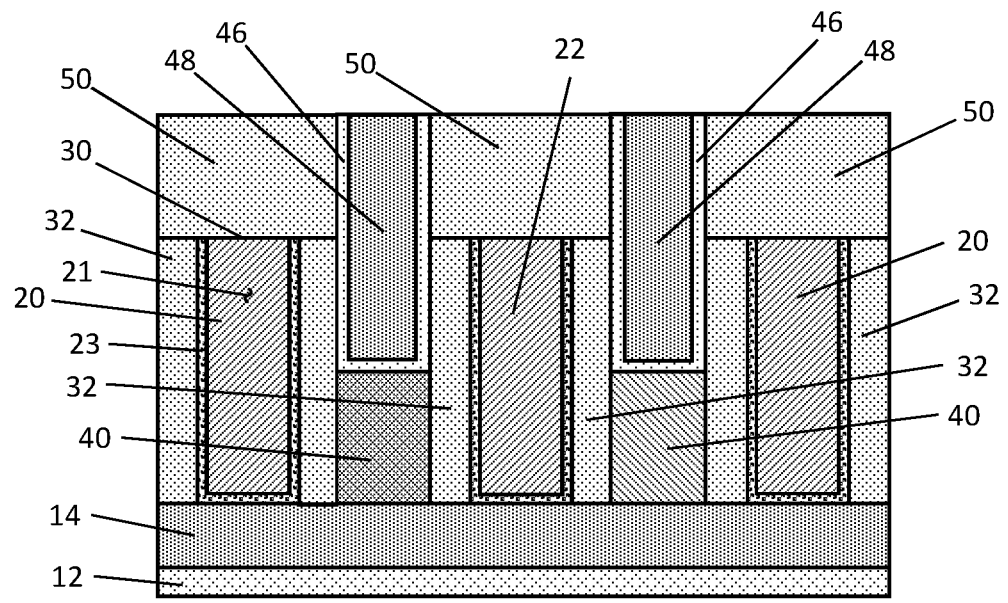
FIGS. 3-9 and 3A-9A are cross-sectional views of the structure at successive fabrication stages of the processing method respectively subsequent to FIGS. 2 and 2A.
Figure 3A:
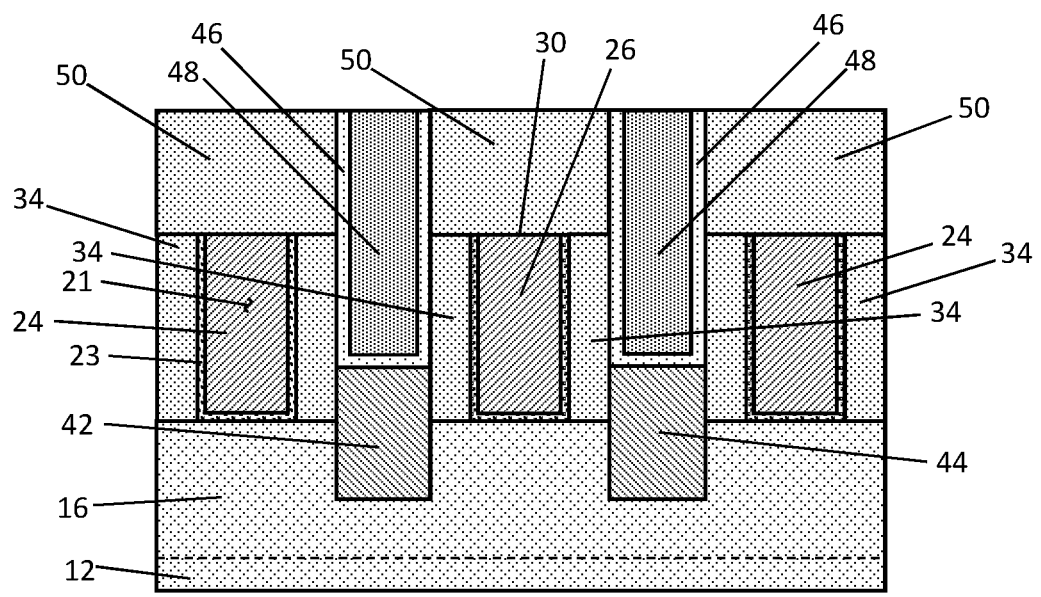

With reference to FIGS. 3 and 3A in which like reference numerals refer to like features in FIGS. 2 and 2A and at a subsequent fabrication stage of the processing method, the portions of the sidewall spacers 32, 34 arranged above the recessed top surfaces 30 of the gate structures 20, 22, 24, 26 are removed with an etching process. The partial removal of the sidewall spacers 32, 34 widens the cavities 47 (FIGS. 2, 2A). The etching process may include, for example, a reactive ion etching process that removes the material of the sidewall spacers 32, 34 selective to the materials of the gate structures 20, 22, 24, 26, the CESL 46, and the interlayer dielectric layer 48. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The height of the recessed sidewall spacers 32, 34 is effectively shortened by the etching process, and the recessed sidewall spacers 32, 34 may be coplanar with the gate structures 20, 22, 24, 26.

After the sidewall spacers 32, 34 are etched, self-aligned contact caps 50 are formed as gate caps (i.e., dielectric caps) in the widened cavities 47 over the gate structures 20, 22, 24, 26. The self-aligned contact caps 50 may be may be composed of a dielectric material, such as silicon nitride, that is deposited by chemical vapor deposition and then planarized with chemical-mechanical polishing.

Figure 4:
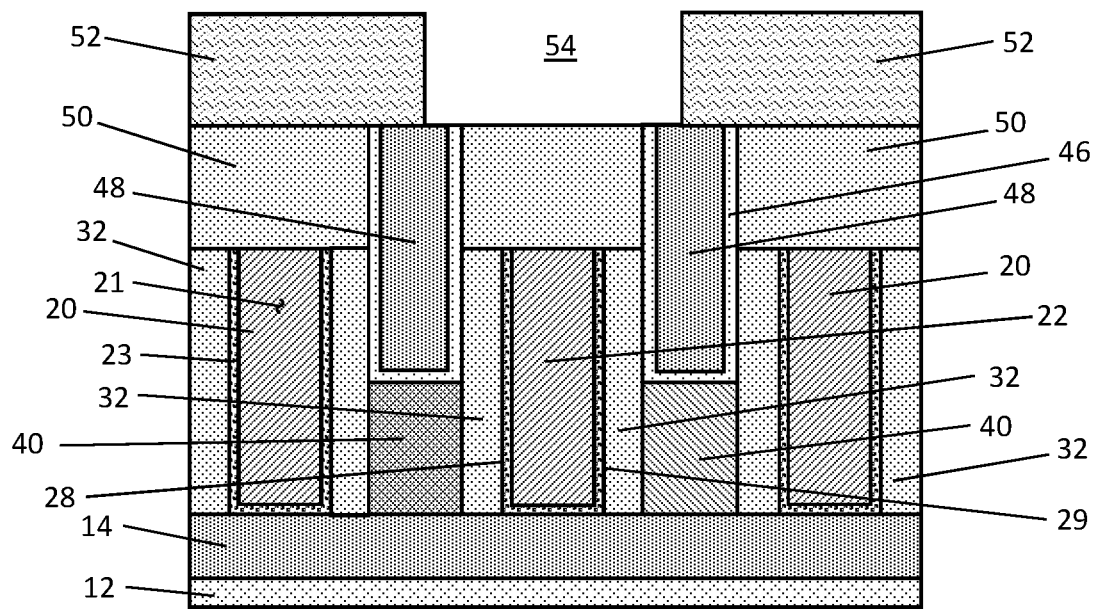
Figure 4A:
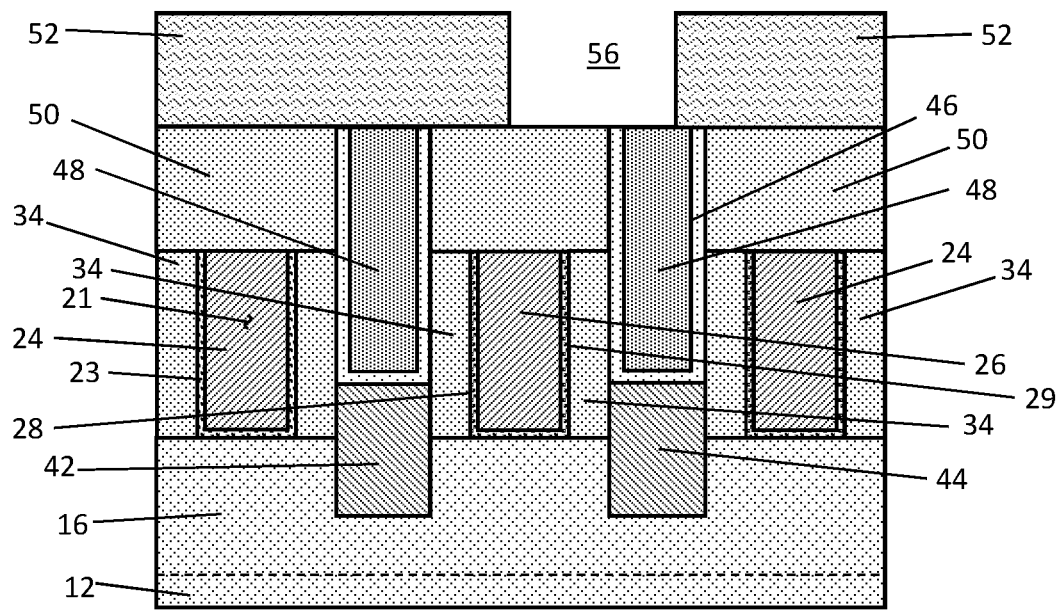

With reference to FIGS. 4 and 4A in which like reference numerals refer to like features in FIGS. 3 and 3A and at a subsequent fabrication stage of the processing method, an etch mask 52 is formed by applying a lithography stack and patterning the lithography stack to generate openings 54, 56. The etch mask 52 may include an organic planarization layer (OPL) material and an anti-reflection coating in the lithography stack that are patterned with lithography and etching processes.

The opening 54 in the etch mask 52 exposes the self-aligned contact cap 50 over the gate structure 22, as well as the CESL 46 and the sections of the interlayer dielectric layer 48 that are arranged adjacent to the opposite sidewalls 28, 29 of the gate structure 22. The opening 56 in etch mask 52 exposes a portion of the self-aligned contact cap 50 over the gate structure 26, as well as the CESL 46 and the section of the interlayer dielectric layer 48 only adjacent to the sidewall 29 of the gate structure 26. A portion of the self-aligned contact cap 50 over the gate structure 26, as well as the CESL 46 and section of the interlayer dielectric layer 48 adjacent to the sidewall 28 of the gate structure 26, are covered and masked by the etch mask 52.

The opening 54 in the etch mask 52 defines a location for the subsequent formation of a gate contact extending to the gate structure 22. The opening 56 in the etch mask 52 defines a location for the subsequent formation of a cross-coupling contact connecting the gate structure 26 with epitaxial semiconductor layer 44 that is located adjacent to the gate structure 26.

Figure 5:
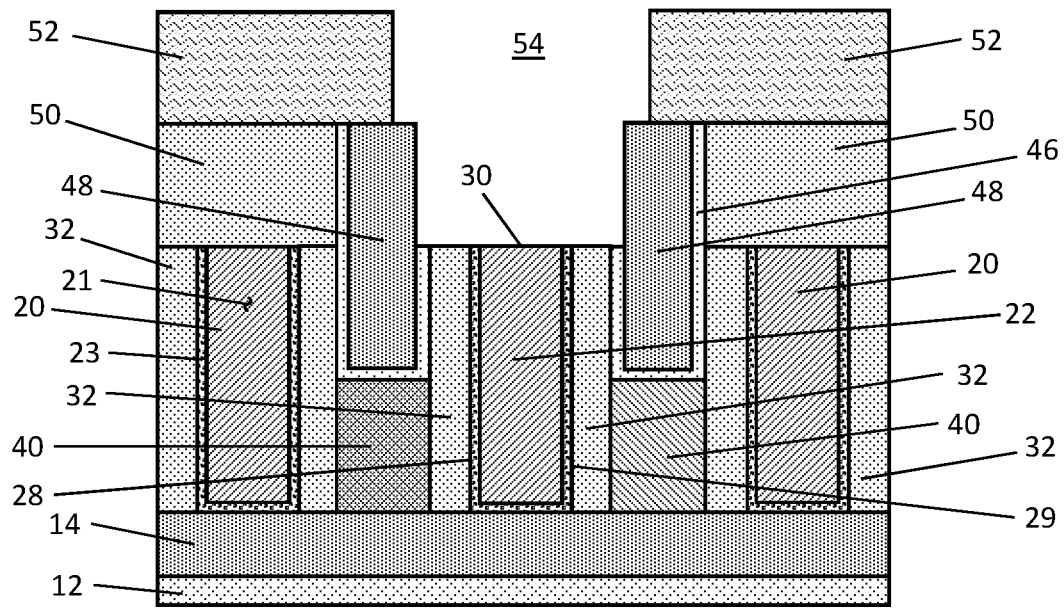
Figure 5A:
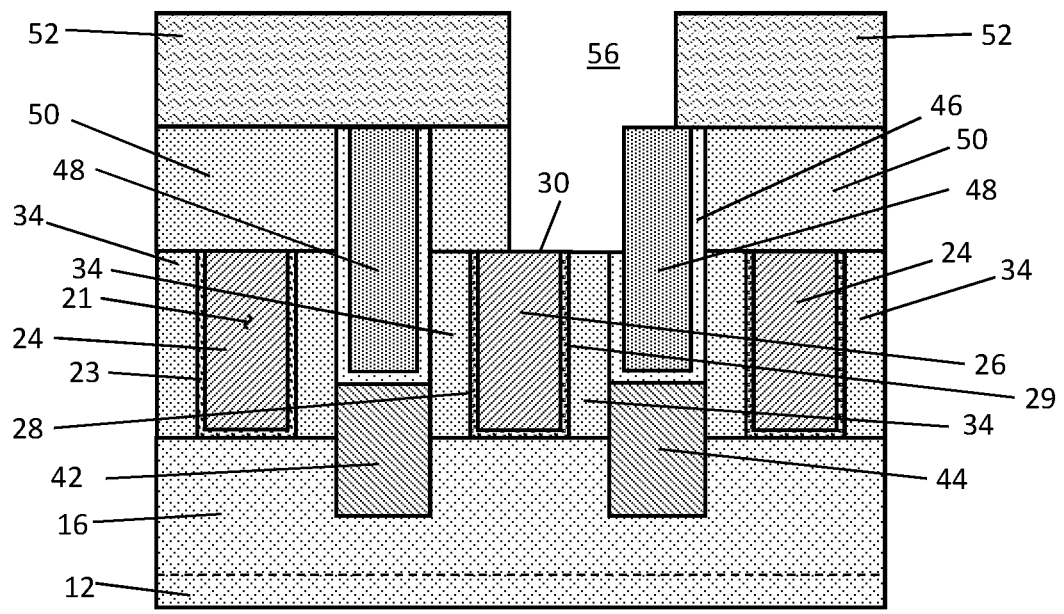

With reference to FIGS. 5 and 5A in which like reference numerals refer to like features in FIGS. 4 and 4A and at a subsequent fabrication stage of the processing method, the self-aligned contact cap 50 exposed by the opening 54 in the etch mask 52 over the gate structure 22 and the portion of self-aligned contact cap 50 exposed by the opening 56 in the etch mask 52 over the gate structure 26 are etched and removed with an etching process, such as a reactive ion etching process. The self-aligned contact cap 50 is completely removed from over the top surface 30 of the gate structure 22. The CESL 46 is also removed to the level of the top surface 30 of the gate structure 22.

Only a portion of the self-aligned contact cap 50 is removed from the top surface 30 of the gate structure 26. The CESL 46 is also removed to the level of the top surface 30 of the gate structure 26 at the sidewall 29 of the gate structure 26. Another portion of the gate structure 26 and the sidewall spacer 34 at the sidewall 28 of this portion of the gate structure 26 remain covered by the partially-removed self-aligned contact cap 50.

In conventional fabrication processes forming cross-coupling contacts, the self-aligned contact cap is not etched until after removal of the interlayer dielectric layer for trench silicide formation. In contrast, the epitaxial semiconductor layer 44 is masked and protected by the interlayer dielectric layer 48, sidewall spacers 32, 36, and CESL 46 during the etching of the self-aligned contact cap 50 over the gate structure 26. The interlayer dielectric layer 48 is removed in a subsequent fabrication stage of the process flow, as subsequently described, and only after the self-aligned contact cap 50 over the gate structure 26 has been etched to permit formation of the cross-coupling contact.

Figure 6:
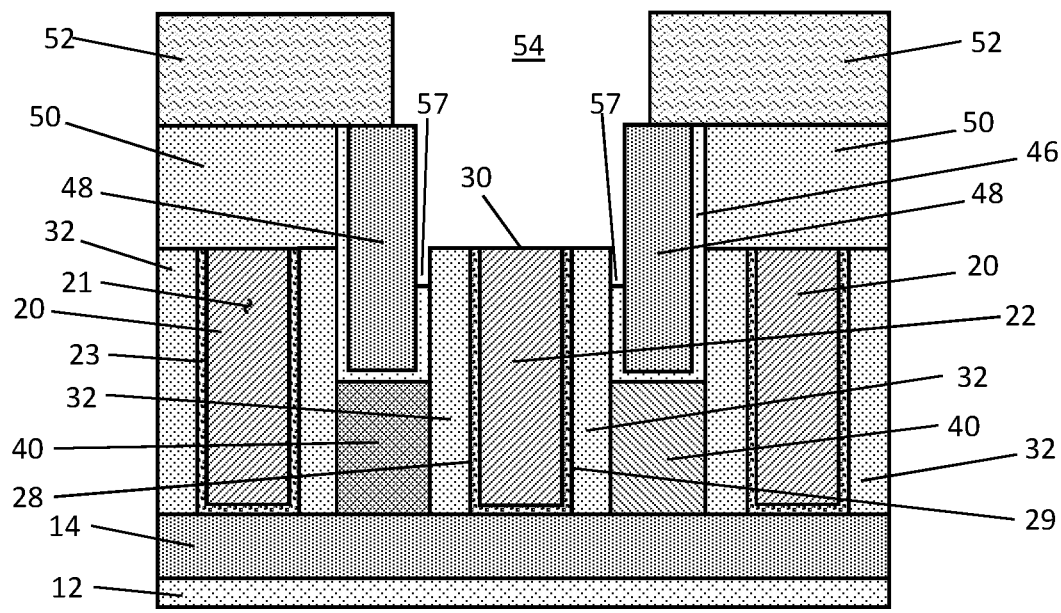
Figure 6A:
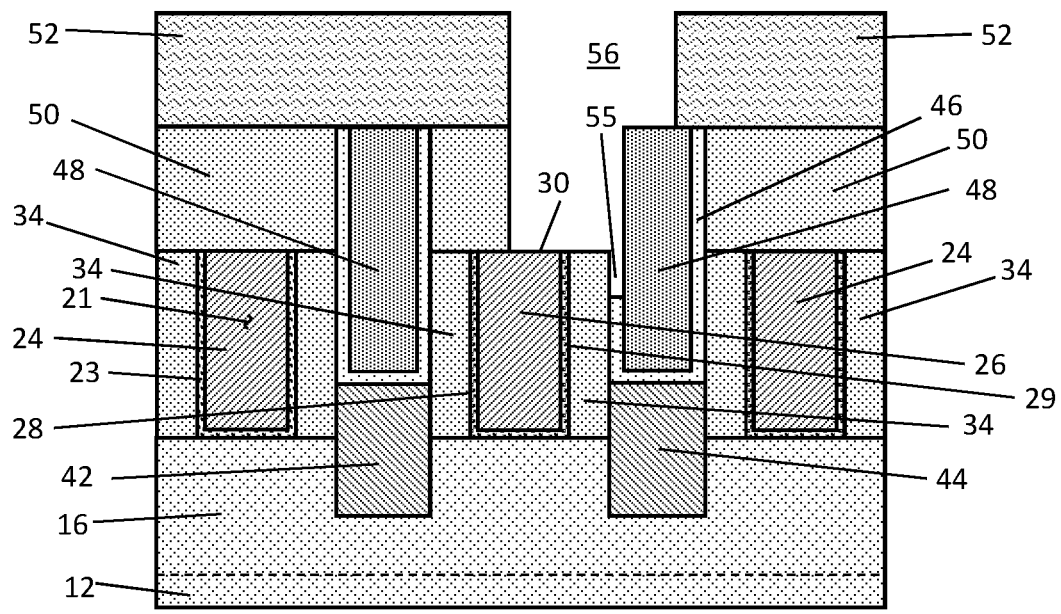

With reference to FIGS. 6 and 6A in which like reference numerals refer to like features in FIGS. 5 and 5A and at a subsequent fabrication stage of the processing method, a portion of the CESL 46 between the sidewall spacer 36 adjacent to the sidewall 29 of the gate structure 26 and the adjacent section of the interlayer dielectric layer 48 is exposed when the portion of the self-aligned contact cap 50 is removed. This portion of the CESL 46 is recessed by an etching process relative to the top surface 30 of the gate structure 26 and the top surface of the sidewall spacer 34 to form a cavity 55. The cavity 55 is arranged between the sidewall spacer 34 at the sidewall 29 of the gate structure 26 and the adjacent section of the interlayer dielectric layer 48. The cavity 55 exposes an upper portion of one of the sidewall spacers 34 adjacent to the sidewall 29 of the gate structure 26

Portions of the CESL 46 are also exposed by the removal of the self-aligned contact cap 50 over the gate structure 22. The etching process also recesses these portions of the CESL 46 relative to the top surface of the gate structure 22 and the top surface of the sidewall spacers 32 to form cavities 57. The cavities 57 are arranged between the sidewall spacers 32 and the adjacent sections of the interlayer dielectric layer 48. The cavities 57 expose an upper portion of the sidewall spacers 32 adjacent to the sidewalls 28, 29 of the gate structure 22.

The etching process used to form the cavities 55, 57 may include, for example, a reactive ion etching process that removes the material of CESL 46 selective to the materials of the gate structures 22, 26, the sidewall spacers 32, 34, and the interlayer dielectric layer 48. The etch mask 52 is removed by, for example, an ashing process following the performance of the etching process.

Figure 7:
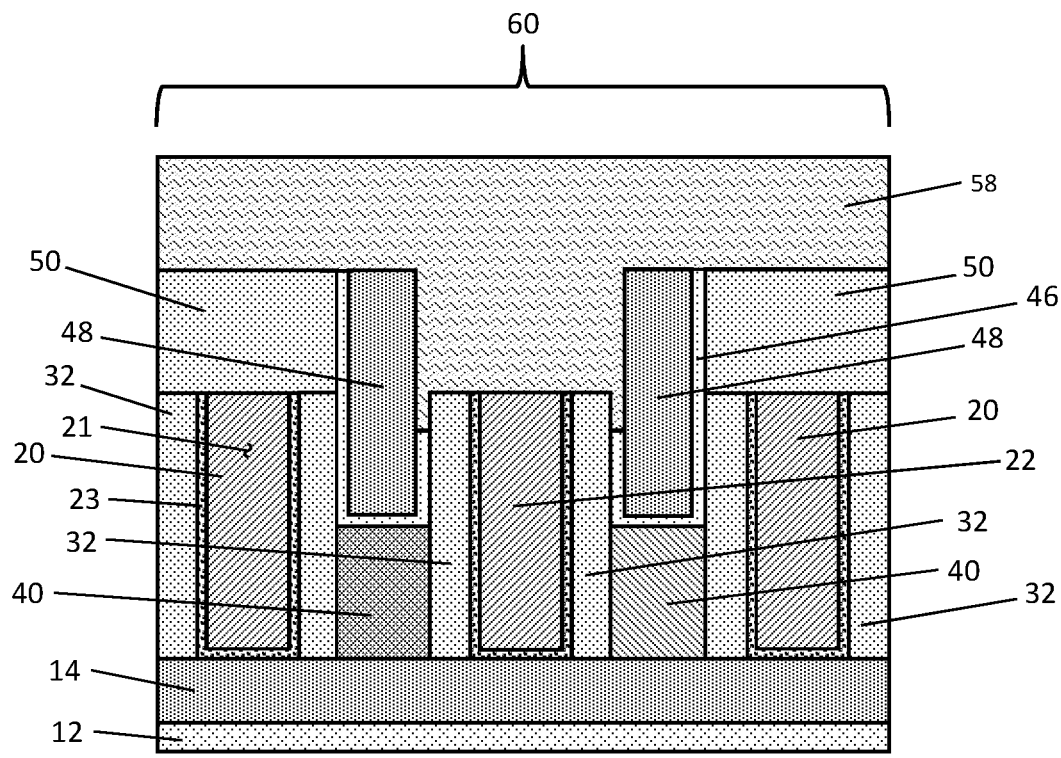
Figure 7A:
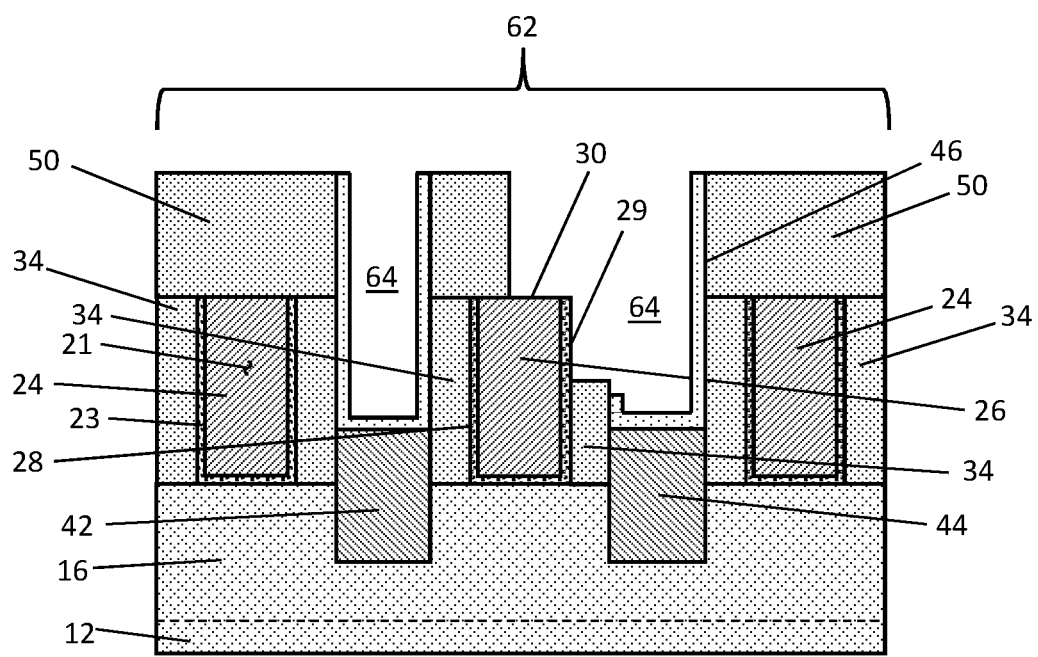

With reference to FIGS. 7 and 7A in which like reference numerals refer to like features in FIGS. 6 and 6A and at a subsequent fabrication stage of the processing method, an etch mask 58 is formed by applying a lithography stack and patterning the lithography stack such that the etch mask 58 covers an area 60 including the gate structures 20, 22 and exposes an area 62 including the gate structures 24, 26. The etch mask 58 may include an organic planarization layer (OPL) material and an anti-reflection coating that are patterned with lithography and etching processes.

The sections of the interlayer dielectric layer 48 exposed in the area 62 are removed from their respective locations over the sections of the epitaxial semiconductor layers 42, 44, which generates openings 64. At the intended location for the cross-coupling contact, one of the openings 64 also exposes a portion of the sidewall 29 of the gate structure 26 that participates in the cross-coupling contact. The interlayer dielectric layer 48 may be etched, for example, by a reactive ion etching process that removes the material of the interlayer dielectric layer 48 selective to the material of the gate electrode 21 of gate structure 26.

The etching process removing the sections of the interlayer dielectric layer 48 may also partially etch, but not remove, the sidewall spacer 34 and section of the CESL 46 arranged adjacent to the sidewall 29 of the gate structure 26 such that the sidewall spacer 34 is recessed relative to the top surface 30 of the gate structure 26 and the section of the CESL 46 is further recessed relative to the top surface 30 of the gate structure 26. The sidewall spacers 34 adjacent to the gate structures 24, as well as the sidewall spacer 32 adjacent to the sidewall 28 of the gate structure 26, are covered and fully protected by the CESL 46 and the self-aligned contact caps 50. The partial removal of the sidewall spacer 34 between the sidewall 29 of the gate structure 26 and the adjacent section of the epitaxial semiconductor layer 44 exposes a portion of the sidewall 29 of the gate structure 26 in addition to portion of the top surface 30 exposed by the removal of the self-aligned contact cap 50 over the gate structure 26. The portion of the sidewall 29 is not covered by the partially-removed sidewall spacer 34.

The sidewall spacer 34 adjacent to the sidewall 29 of the gate structure 26 is shorter in height than the sidewall spacer 34 adjacent to the sidewall 28 of the gate structure 26. Similarly, the section of the CESL 46 adjacent to the sidewall 29 of the gate structure 26 is shorter in height than the section of the CESL 46 adjacent to the sidewall 28 of the gate structure 26. These heights may be measured, for example, relative to the top surface of the fin 16.

Figure 8:
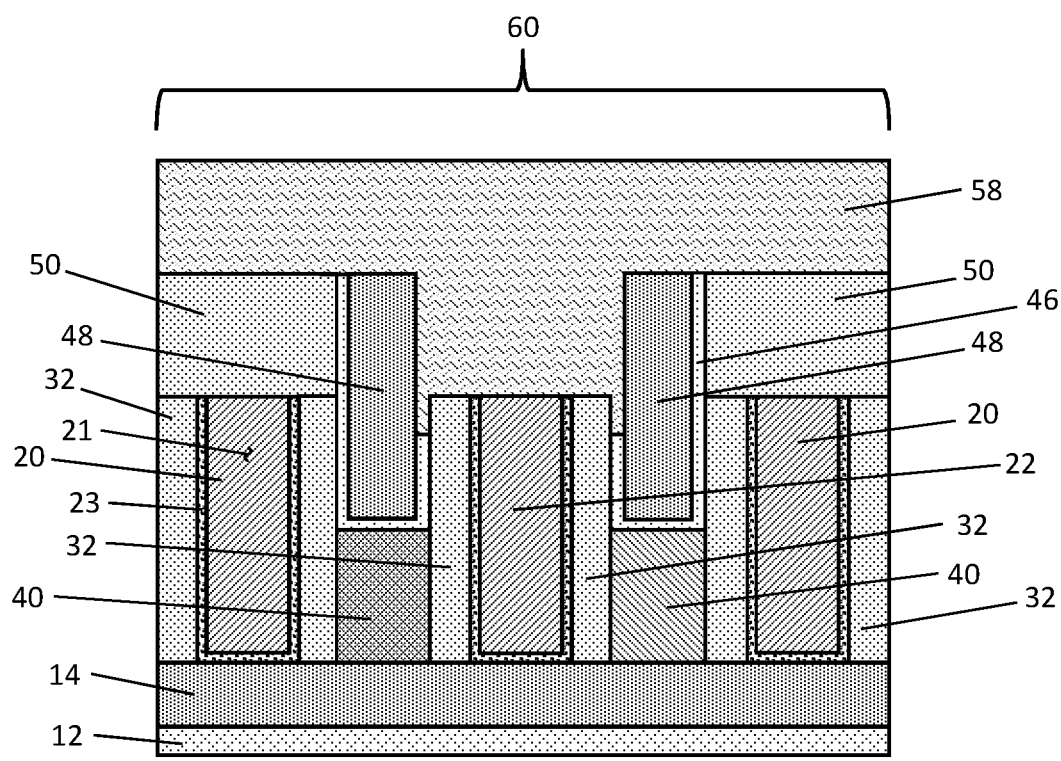
Figure 8A:
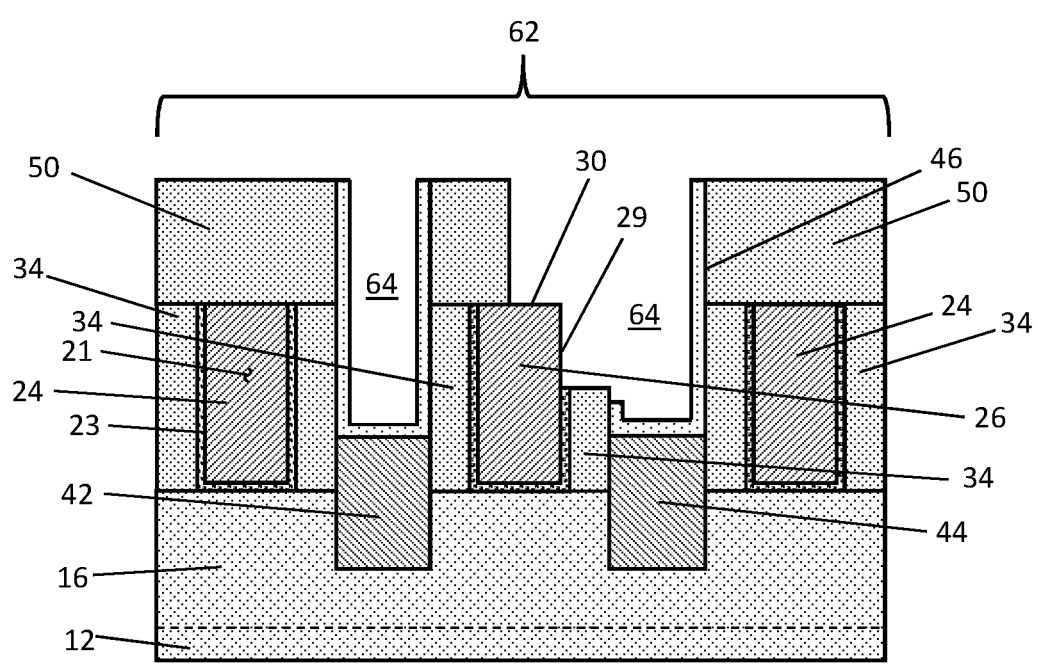

With reference to FIGS. 8 and 8A in which like reference numerals refer to like features in FIGS. 7 and 7A and at a subsequent fabrication stage of the processing method, the gate dielectric layer 23 is removed from the sidewall 29 of the gate structure 26 to expose a portion of the gate electrode 21 at the sidewall 29 arranged above the partially-removed sidewall spacer 34. The gate dielectric layer 23 of the gate structure may be removed by an etching process that is selective to its gate electrode 21. The gate dielectric layer 23 of the gate structure 26 is preserved between the partially-removed sidewall spacer 34 and the gate electrode 21 of the gate structure 26. Following the performance of the etching process, the etch mask 58 is removed by, for example, an ashing process.

Figure 9:
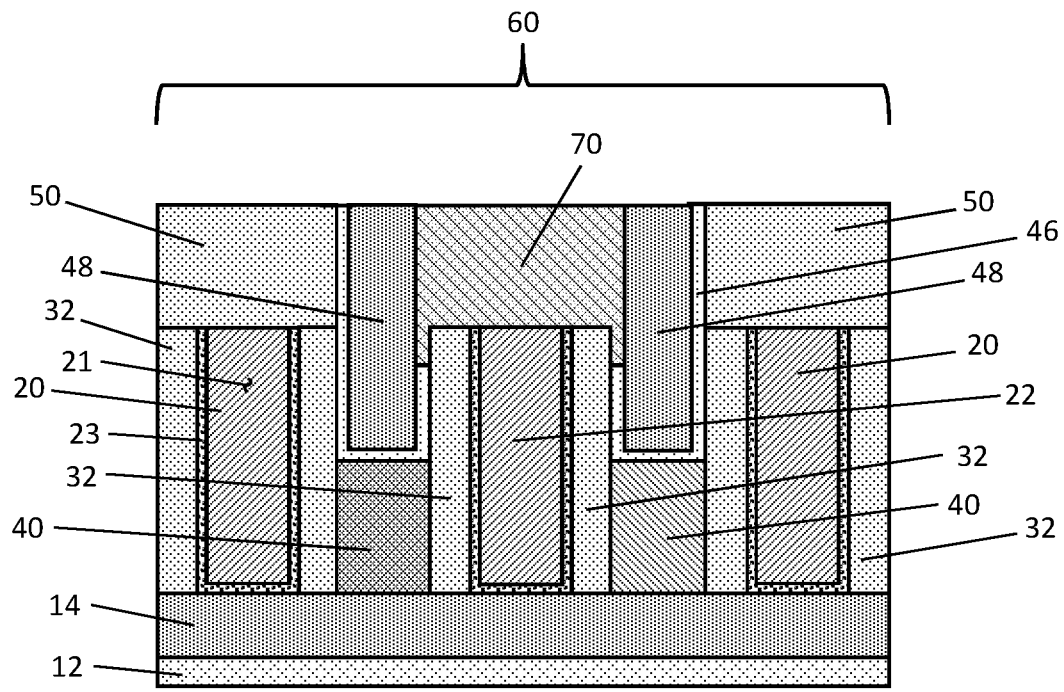
Figure 9A:
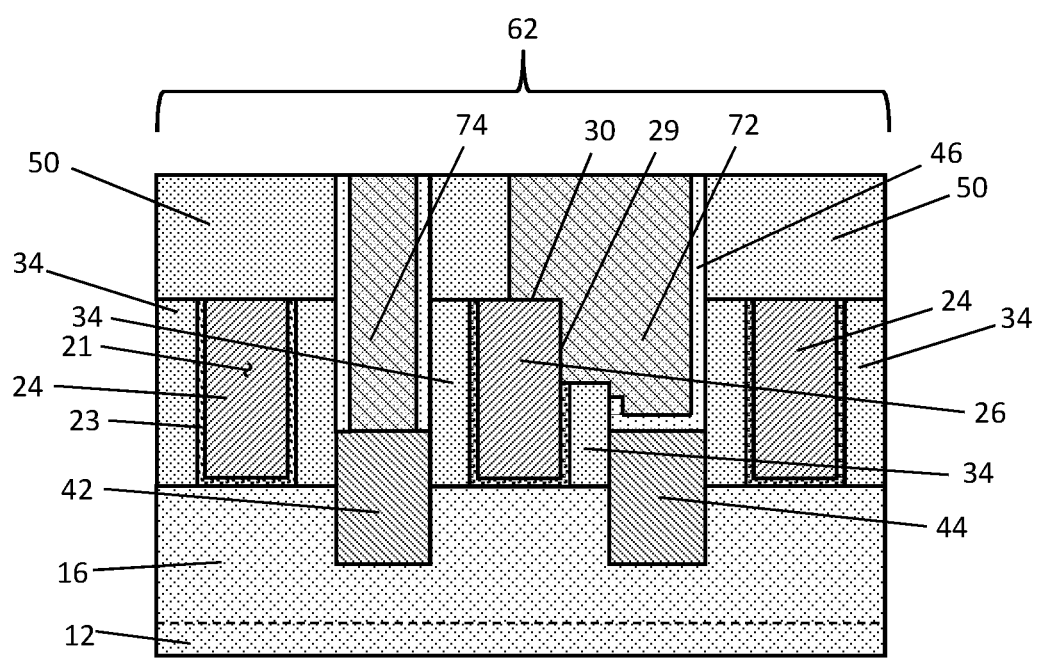

With reference to FIGS. 9 and 9A in which like reference numerals refer to like features in FIGS. 8 and 8A and at a subsequent fabrication stage of the processing method, a gate contact 70 may be formed over gate structure 22 and a cross-coupling contact 72 may be concurrently formed over gate structure 26 and epitaxial semiconductor layer 44. The gate contact 70 and the cross-coupling contact 72 may contain a metal silicide layer and a metal fill layer deposited by chemical vapor deposition or atomic layer deposition and then planarized by a chemical-mechanical planarization process. A source/drain contact 74 may also be formed that extends to the epitaxial semiconductor layer 42 either concurrently with the formation of the contacts 70, 72 or separately.

The gate contact 70 has a directly contacting relationship with the gate electrode 21 exposed at the top surface of the gate structure 22. Portions of the gate contact 70 fill the cavities 57 (FIG. 8) over the CESL 46 that are arranged between the sidewall spacers 32 and the adjacent sections of the interlayer dielectric layer 48.

The cross-coupling contact 72 directly contacts the gate electrode 21 of the gate structure 26 at the exposed portions of the sidewall 29 and top surface 30. The cross-coupling contact 72 is also directly contacts the epitaxial semiconductor layer 44 adjacent to the gate structure 26. The cross-coupling contact 72 connects the gate structure 26 and the epitaxial semiconductor layer 44 so that the gate structure 26 is conductively coupled with the epitaxial semiconductor layer 44. Following planarization, the cross-coupling contact 72 has a thickness and area of contact with the gate electrode 21 of the gate structure 26 at its sidewall 29 and top surface 30 that is increased by the recessing of the gate structure 26, the sidewall spacer 36, and the CESL 46.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly" on or in "direct contact" with another feature if intervening features are absent. A feature may be "indirectly" on or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first gate structure including a first sidewall and a second sidewall opposite from the first sidewall;
a first liner;
a first sidewall spacer adjacent to the first sidewall of the first gate structure, the first sidewall spacer arranged between the first liner and the first sidewall of the first gate structure;
a second liner;
a second sidewall spacer adjacent to the second sidewall of the first gate structure, the second sidewall spacer arranged between the second liner and the second sidewall of the first gate structure;
a first epitaxial semiconductor layer separated from the first gate structure by the first liner and the first sidewall spacer; and
a cross-coupling contact extending over the first sidewall spacer and the first liner to connect the first gate structure with the first epitaxial semiconductor layer,
wherein the first sidewall spacer is shorter than the second sidewall spacer, and the first liner is shorter than the second liner.

2. The structure of claim 1 further comprising:
a semiconductor fin arranged below the first gate structure,
wherein the first sidewall spacer and the first liner are arranged in a vertical direction between the cross-coupling contact and the semiconductor fin.

3. The structure of claim 1 further comprising:
a second gate structure including aسidewall;
a third liner;
a third sidewall spacer adjacent to the sidewall of the second gate structure, the third sidewall spacer arranged between the third liner and the second gate structure; and
a gate contact coupled with the second gate structure,
wherein the third liner has a recessed relationship relative to the third sidewall spacer.

4. The structure of claim 1 wherein the first gate structure has a top surface and a sidewall, the first gate structure includes a gate electrode, and the cross-coupling contact is in direct contact with the gate electrode over a first portion of the gate electrode at the top surface of the first gate structure and over a second portion of the gate electrode at the sidewall of the first gate structure.

5. The structure of claim 1 wherein the first gate structure includes a gate electrode having a top surface, the cross-coupling contact is in direct contact with a first portion of the top surface of the gate electrode of the first gate structure, and further comprising:
- a self-aligned contact cap arranged in a vertical direction over a second portion of the top surface of the first gate structure.

6. The structure of claim 5 wherein the self-aligned contact cap is arranged over the second sidewall spacer.

7. The structure of claim 1 wherein the first sidewall spacer and the second sidewall spacer are comprised of a low-k dielectric material, and the first liner and the second liner are composed of silicon nitride.

* * * * *